United States Patent
Yakabe et al.

(10) Patent No.: US 10,340,311 B2
(45) Date of Patent: Jul. 2, 2019

(54) MAGNETORESISTIVE EFFECT ELEMENT WITH MAGNETIC LAYERS AND MAGNETIC MEMORY

(71) Applicant: Toshiba Memory Corporation, Minato-ku (JP)

(72) Inventors: Megumi Yakabe, Kawasaki (JP); Satoshi Seto, Kamakura (JP); Chikayoshi Kamata, Kawasaki (JP); Saori Kashiwada, Yokohama (JP); Junichi Ito, Yokohama (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 15/696,751

(22) Filed: Sep. 6, 2017

(65) Prior Publication Data

US 2018/0138237 A1    May 17, 2018

(30) Foreign Application Priority Data

Nov. 11, 2016    (JP) .................. 2016-220922

(51) Int. Cl.
*H01L 43/02* (2006.01)
*H01L 27/22* (2006.01)
*H01L 43/08* (2006.01)
*H01L 43/10* (2006.01)

(52) U.S. Cl.
CPC ............ *H01L 27/228* (2013.01); *H01L 43/02* (2013.01); *H01L 43/08* (2013.01); *H01L 43/10* (2013.01)

(58) Field of Classification Search
None
See application file for complete search history.

(56) References Cited

U.S. PATENT DOCUMENTS

| | | | |
|---|---|---|---|
| 2014/0070162 A1* | 3/2014 | Iwayama | H01L 43/08 257/4 |
| 2016/0013397 A1 | 1/2016 | Kitagawa et al. | |
| 2016/0072045 A1 | 3/2016 | Kanaya et al. | |
| 2016/0276574 A1* | 9/2016 | Ohsawa | H01L 43/08 |
| 2017/0062520 A1* | 3/2017 | Sato | H01L 43/02 |

FOREIGN PATENT DOCUMENTS

JP    2016/0013397 A1    2/2016

* cited by examiner

*Primary Examiner* — Bilkis Jahan
(74) *Attorney, Agent, or Firm* — Oblon, McClelland, Maier & Neustadt, L.L.P.

(57) ABSTRACT

According to one embodiment, a magnetoresistive effect element includes: a first magnetic layer; a nonmagnetic layer provided on the first magnetic layer; a second magnetic layer provided on the nonmagnetic layer; a first insulating layer provided at least on a side surface of the second magnetic layer; a second insulating layer covering at least a part of the first insulating layer; a conductive layer provided between the first insulating layer and the second insulating layer; and a first electrode including a first portion on the second magnetic layer and a second portion on a side surface of the second insulating layer. A height of a lower surface of the second portion is equal to or less than a height of an upper surface of the conductive layer.

10 Claims, 13 Drawing Sheets

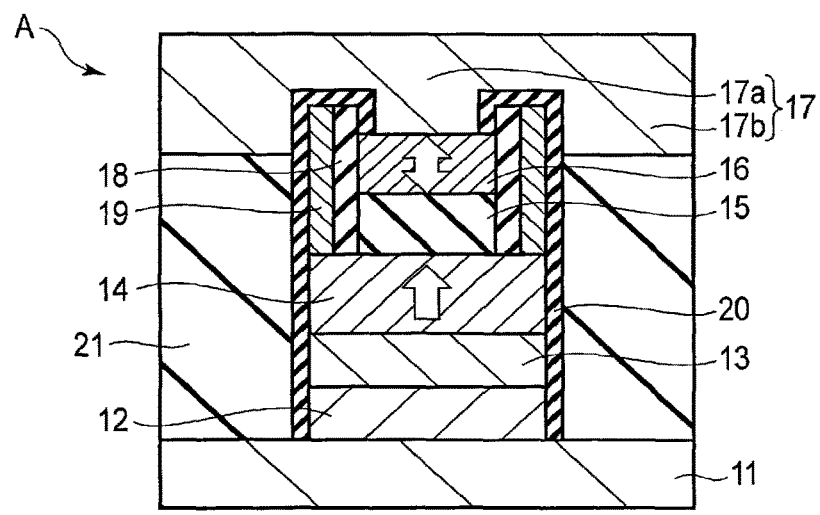
F I G. 1
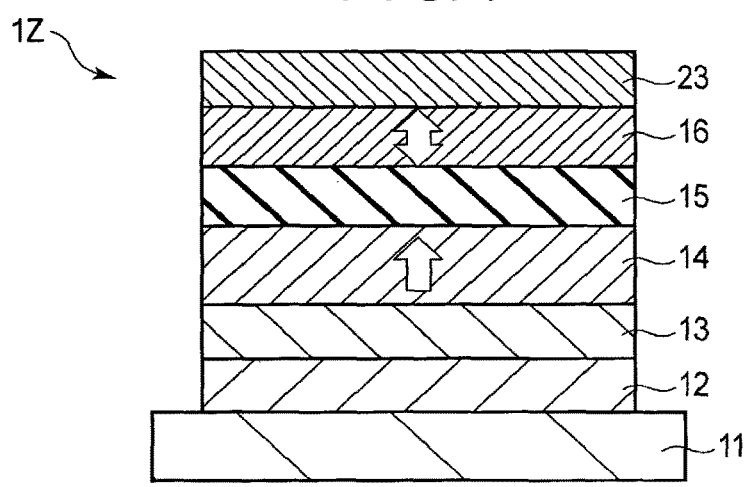
F I G. 2A
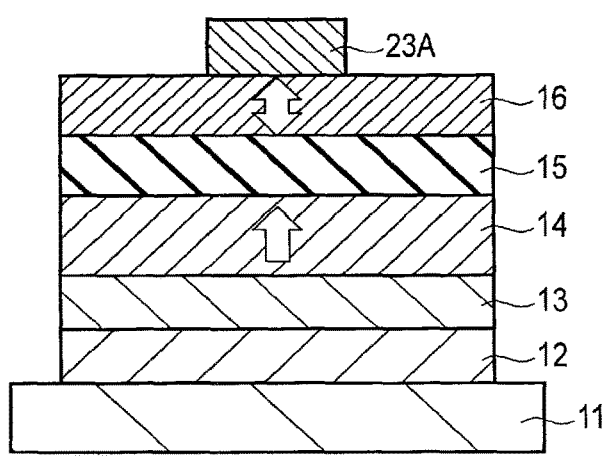
F I G. 2B

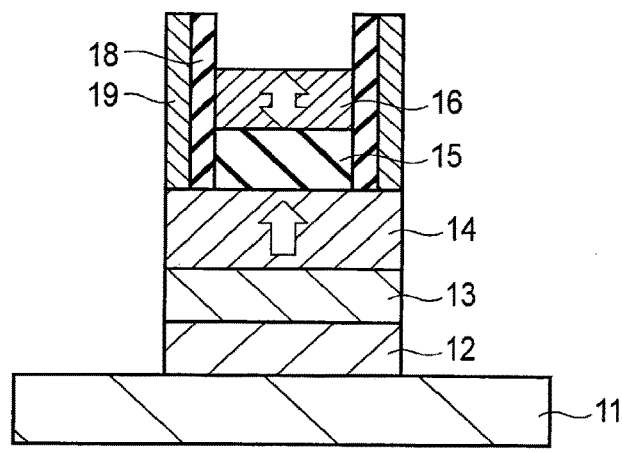
F I G. 3A
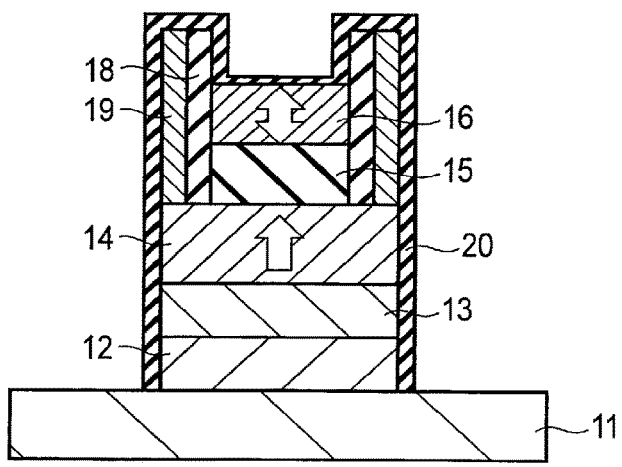
F I G. 3B
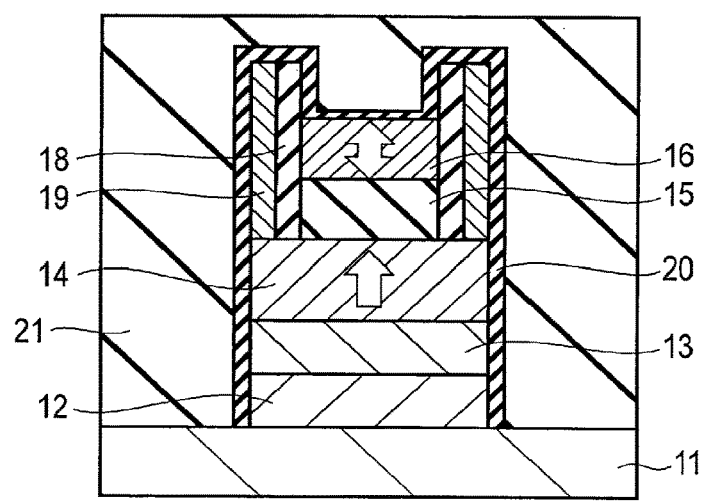
F I G. 3C

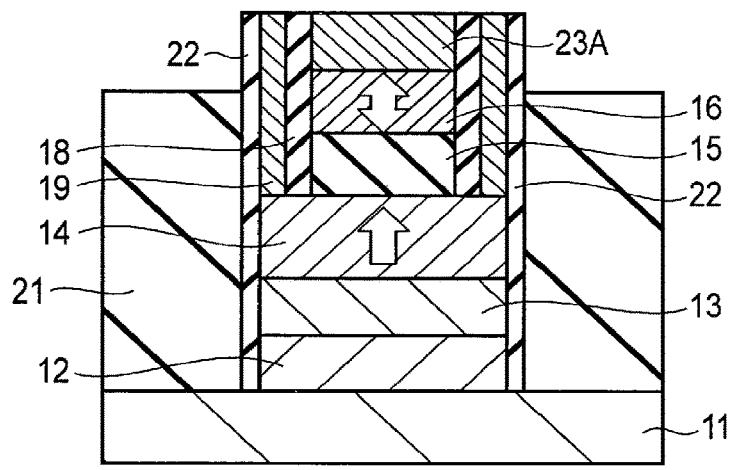
F I G. 7C
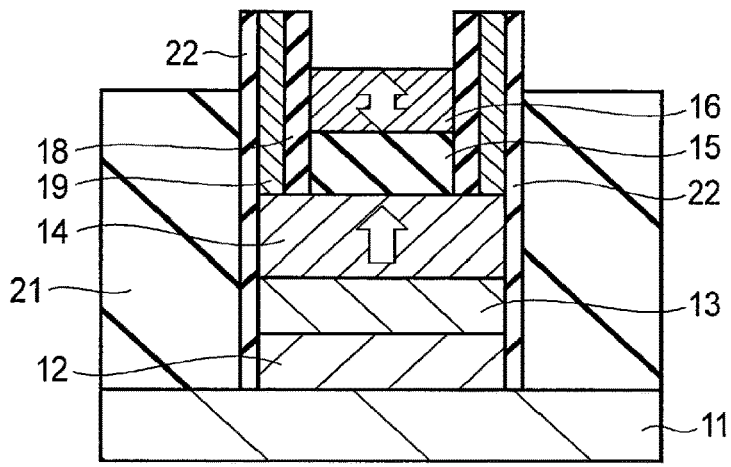
F I G. 7D
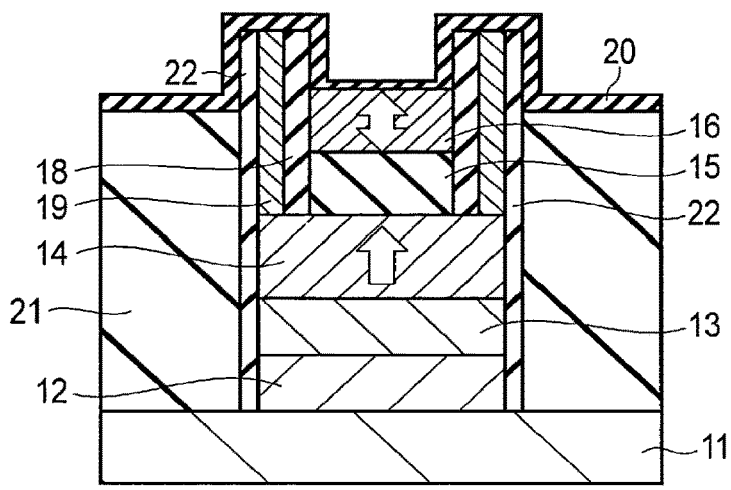
F I G. 7E

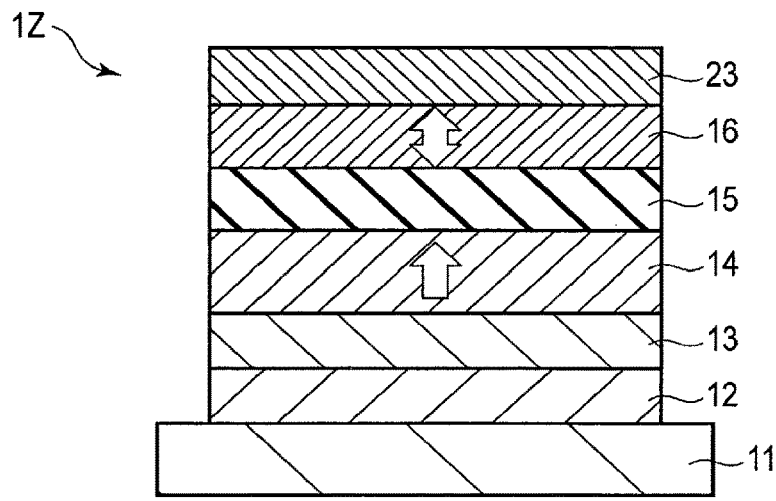
F I G. 9A
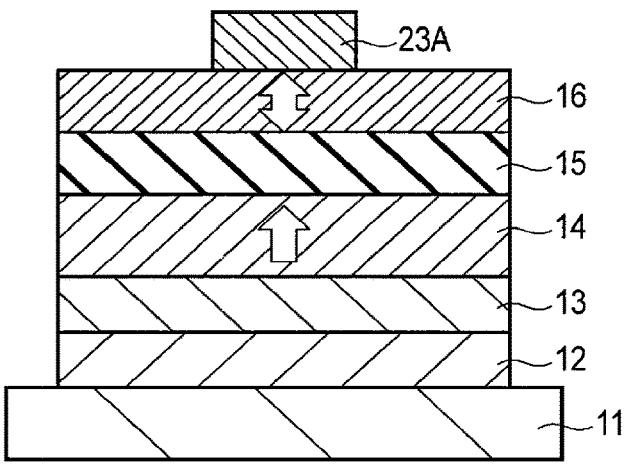
F I G. 9B
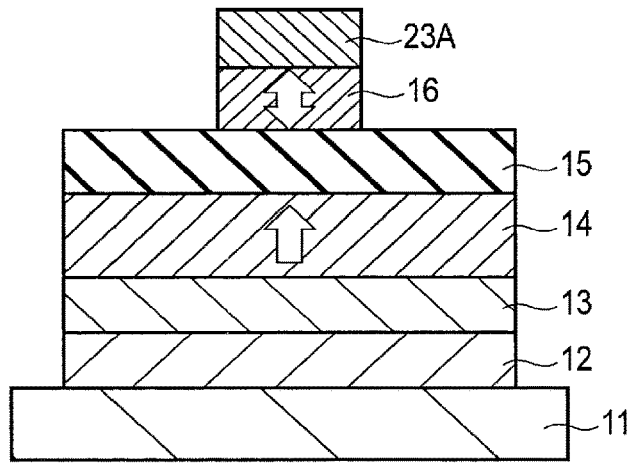
F I G. 9C

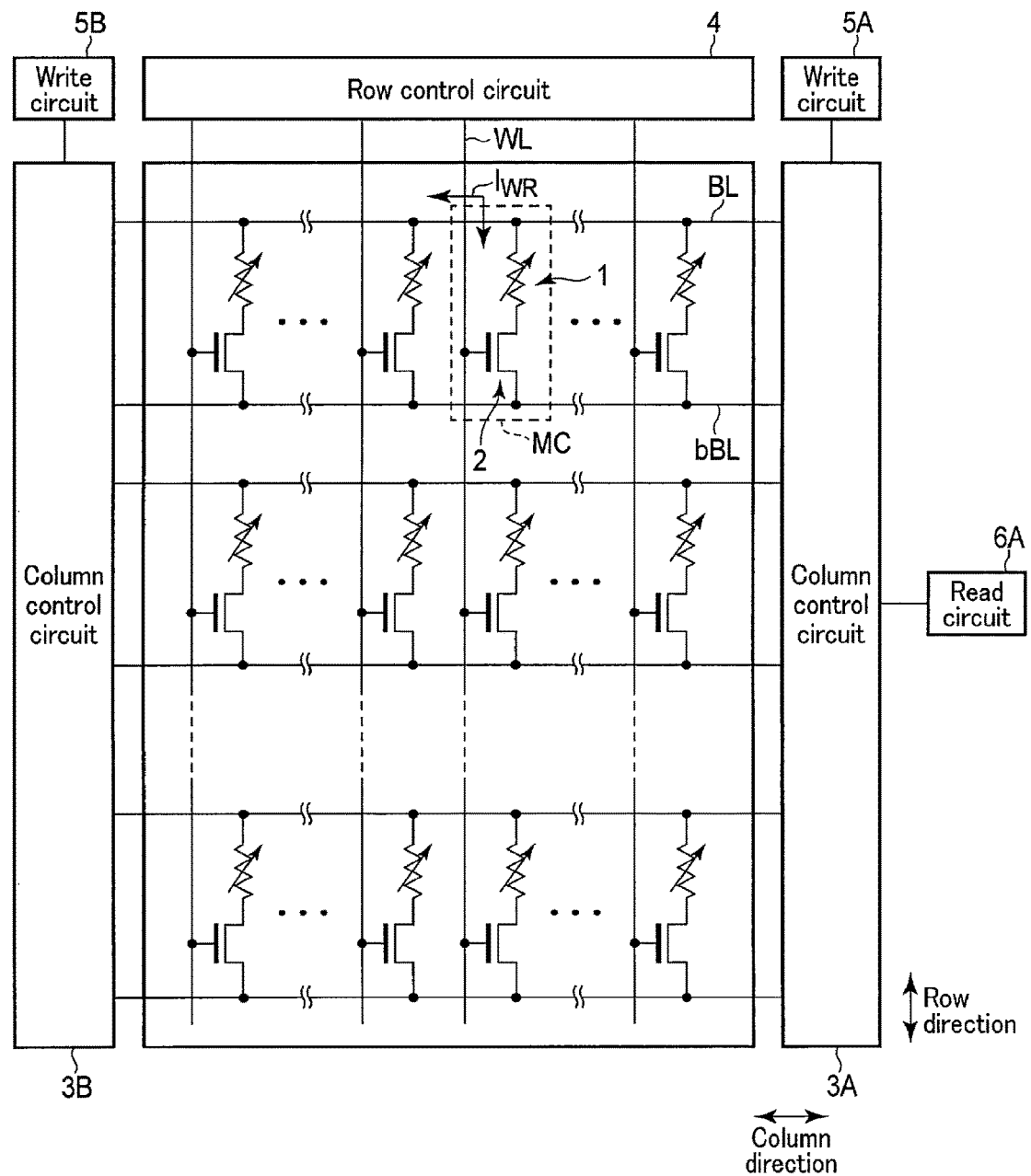
F I G. 10

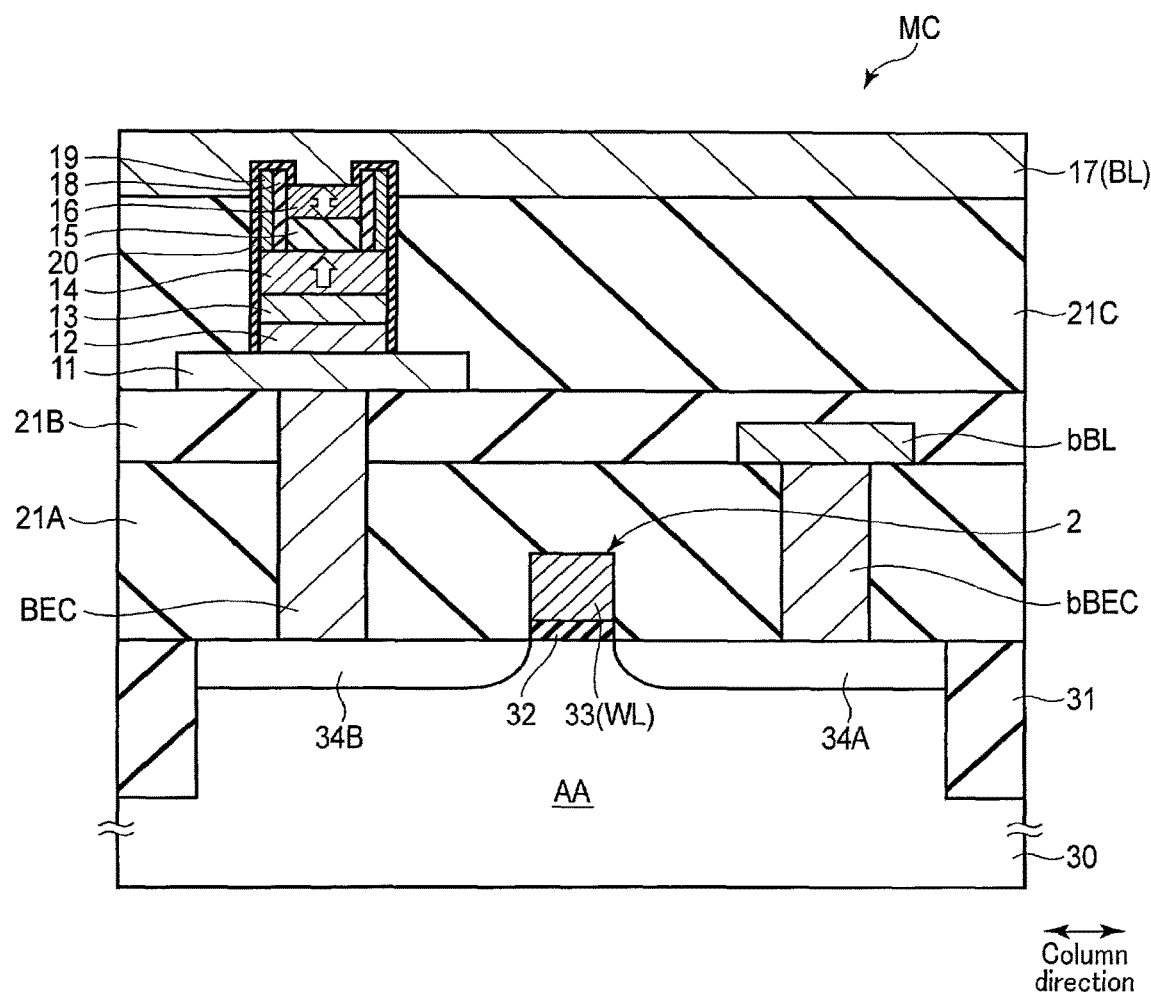
F I G. 11

MAGNETORESISTIVE EFFECT ELEMENT WITH MAGNETIC LAYERS AND MAGNETIC MEMORY

CROSS-REFERENCE TO RELATED APPLICATIONS

This application is based upon and claims the benefit of priority from Japanese Patent Application No. 2016-220922, filed Nov. 11, 2016, the entire contents of which are incorporated herein by reference.

FIELD

Embodiments described herein relate generally to a magnetoresistive effect element and a magnetic memory.

BACKGROUND

Magnetoresistive effect elements using magnetism such as hard disk drives (HDD) and magnetic random access memories (MRAM) have been developed.

A redeposit adhering to a side surface when the magnetoresistive effect element is processed may be in contact with an electrode, which forms a short-circuit path. A method for cutting the short-circuit path is required without damaging the element.

BRIEF DESCRIPTION OF THE DRAWINGS

FIG. 1 is a cross-sectional view of a magnetoresistive effect element of a first embodiment;

FIGS. 2A, 2B, 2C, 2D, and 2E illustrate a method for manufacturing the magnetoresistive effect element of the first embodiment;

FIGS. 3A, 3B, 3C, 3D, and 3E illustrate a method for manufacturing the magnetoresistive effect element of the first embodiment;

FIGS. 7A, 7B, 7C, 7D, 7E, 7F, and 7G illustrate a method for manufacturing the magnetoresistive effect element of the third embodiment;

FIGS. 9A, 9B, 9C, 9D, and 9E illustrate a method for manufacturing the magnetoresistive effect element of the fourth embodiment;

FIG. 10 shows an example of a magnetic storage device; and

FIG. 11 is a cross-sectional view showing a memory cell in the magnetic storage device.

DETAILED DESCRIPTION

Figure 2C:
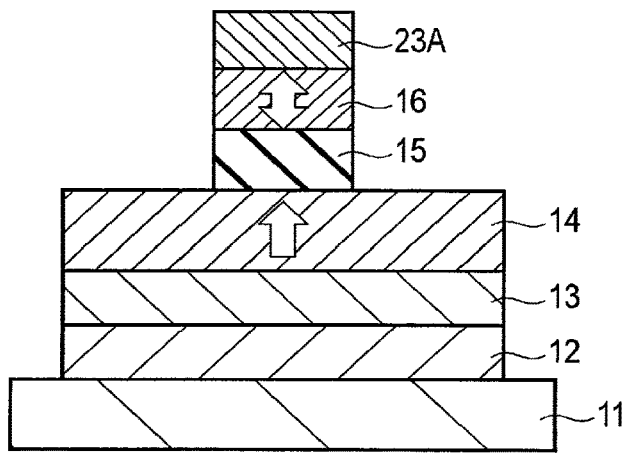

In general, according to one embodiment, there is provided a magnetoresistive effect element comprising:

a first magnetic layer;

a nonmagnetic layer provided on the first magnetic layer;

a second magnetic layer provided on the nonmagnetic layer;

a first insulating layer provided at least on a side surface of the second magnetic layer;

a second insulating layer covering at least a part of the first insulating layer;

a conductive layer provided between the first insulating layer and the second insulating layer; and a first electrode including a first portion on the second magnetic layer and a second portion on a side surface of the second insulating layer, wherein a height of a lower surface of the second portion is equal to or less than a height of an upper surface of the conductive layer.

Embodiments of the present invention will be described below with reference to the drawings. Those with the same reference numerals indicate ones corresponding to each other. The drawings are schematic or conceptual, and the relationships between the thicknesses and widths of portions, and the ratios of the sizes of portions or the like are not necessarily the same as the actual values thereof. The dimensions and the ratios may be illustrated differently between the drawings, even for identical portions.

Herein, "on" and "above" represent the stacking direction of a laminate, and "side surface" and "side" represent a direction intersecting the stacking direction. Typical examples of the intersecting direction include, but not necessarily limited to, a perpendicular direction. On the other hand, a first direction represents the stacking direction of the laminate, and a second direction represents a direction intersecting the first direction. Note that the stacking direction typically corresponds to a direction which connects two layers included in the laminate to each other at the shortest distance.

[First Embodiment]

(Structure)

The structure of a magnetoresistive effect element of a first embodiment will be described using FIG. 1.

As shown in FIG. 1, a magnetoresistive effect element A of the first embodiment includes a lower electrode 11, a shift adjustment layer 12, a spacer layer 13, a first magnetic layer 14, a nonmagnetic layer 15, a second magnetic layer 16, a first insulating layer 18, a second insulating layer 20, a first conductive layer 19, and an upper electrode 17. The shift adjustment layer 12 is stacked on the lower electrode 11. The spacer layer 13 is stacked on the shift adjustment layer 12. The first magnetic layer 14 is stacked on the spacer layer 13. The nonmagnetic layer 15 is stacked on the first magnetic layer 14. The second magnetic layer 16 is stacked on the nonmagnetic layer 15. The upper electrode 17 includes a first portion 17a and a second portion 17b. The first portion 17a of the upper electrode 17 is stacked on the second magnetic layer 16, and the second portion 17b is provided on a side surface of the first portion 17a. That is, it can also be said that the first portion 17a and the second portion 17b face each other in a second direction. The term "face" herein means that portions are opposed to each other. For example, the first portion 17a and the second portion 17b may be in contact with each other; the first portion 17a and the second portion 17b may be separated; or other components may exist between the first portion 17a and the second portion 17b.

In example of FIG. 1, the first magnetic layer 14 has a cross-sectional area S1. The second magnetic layer 16 has a cross-sectional area S2, and S2 is smaller than S1. The shift adjustment layer 12 and the spacer layer 13 have substantially the same cross-sectional area S1, and the nonmagnetic layer 15 has substantially the same cross-sectional area S2 as that of the second magnetic layer 16.

The first insulating layer 18 is provided so as to cover the side surface of the second magnetic layer 16 and the side surface of the nonmagnetic layer 15. The upper end part of the first insulating layer 18 is positioned above the upper surface of the second magnetic layer 16. The first conductive layer 19 is provided so as to be deposited on the side surface of the first insulating layer 18, cover the side surface of the first insulating layer 18, and reach the vicinity of the upper electrode 17. The first conductive layer 19 is in contact with the first magnetic layer 14, and exists between the lower end part and upper end part of the first insulating layer 18 on the side surface of the first insulating layer 18. The first conductive layer 19 may not exist up to the upper end part, or it may exist, for example, up to a position lower than that of the upper end part. That is, the height of the upper end part of the first conductive layer 19 can be said to be equal to or greater than the height of the lower surface of the second portion 17b of the upper electrode 17. The side surfaces of the first conductive layer 19, first magnetic layer 14, spacer layer 13, and shift adjustment layer 12 are covered with the second insulating layer 20 together with the projecting portions of the first insulating layer 18 and first conductive layer 19. That is, in the second direction, the first insulating layer 18 is provided to face the second magnetic layer 16 and the first portion 17a. The second insulating layer 20 is provided to face the first insulating layer 18, the first magnetic layer 14, the spacer layer 13, and the shift adjustment layer 12 in the second direction. The first conductive layer 19 exists between the first insulating layer 18 and the second insulating layer 20. At least a part of the second insulating layer is provided between the second portion 17b and the first conductive layer 19 in the second direction. The height of the lower surface of the second portion 17b is equal to or less than the height of the upper end part of the first conductive layer 19. Here, the height of the lower surface of the second portion 17b refers to the height of the lower surface at a position closest to the second insulating layer 20 (also including a case where the second portion 17b is in contact with the second insulating layer 20).

It can also be said that the first insulating layer 18 surrounds the second magnetic layer 16 in a direction along a plane intersecting the first direction. It can also be said that the second insulating layer 20 surrounds the first insulating layer 18 in the direction along the plane intersecting the first direction. That is, it can be said that the first insulating layer 18 surrounds the side of the second magnetic layer 16. It can also be said that the second insulating layer 20 surrounds the side of the first insulating layer 18. The "surround" may surround the circumference, or may surround at least a part of the circumference.

A third insulating layer 21 exemplified in FIG. 1 is provided so as to cover the circumference of the magnetoresistive effect element A and be in contact with the lower electrode 11 and the upper electrode 17.

For example, each of the shift adjustment layer 12, the spacer layer 13, the first magnetic layer 14, the nonmagnetic layer 15, and the second magnetic layer 16 has a circular shape when viewed from the first direction. That is, each of the shift adjustment layer 12, the spacer layer 13, the first magnetic layer 14, the nonmagnetic layer 15, and the second magnetic layer 16 has a cylindrical shape.

The lower electrode 11 and the third insulating layer 21 may not be in contact with each other regardless of example of FIG. 1. For example, the second insulating layer 20 may be provided between the lower electrode 11 and the third insulating layer 21, or an underlayer may be provided between the lower electrode 11 and the third insulating layer 21.

Regardless of the example of FIG. 1, the cross-sectional areas of the shift adjustment layer 12, spacer layer 13, first magnetic layer 14, nonmagnetic layer 15, and second magnetic layer 16 may be smaller in this order.

In FIG. 1, the first insulating layer 18 covers the side surfaces of the nonmagnetic layer 15 and second magnetic layer 16, but it may cover at least the side surface of the second magnetic layer 16.

In FIG. 1, the shift adjustment layer 12 and the spacer layer 13 are provided between the lower electrode 11 and the first magnetic layer 14, but they may be omitted. In this case, the lower electrode 11 may be in contact with the first magnetic layer 14.

Although not shown in FIG. 1, an intermediate layer preventing the atomic diffusion of the magnetic layer and nonmagnetic layer may be provided at the interface between the second magnetic layer 16 and the nonmagnetic layer 15 and at the interface between the first magnetic layer 14 and the nonmagnetic layer 15.

Regardless of the example of FIG. 1, a second conductive layer protecting the magnetic layer 16 from damage due to hard mask removal or upper electrode formation, or the like may be provided between the second magnetic layer 16 and the upper electrode 17.

Although not shown in FIG. 1, an underlayer improving the crystallinities of the shift adjustment layer 12 and magnetic layer 14 may be provided between the lower electrode 11 and the shift adjustment layer 12.

(Operating Principle)

Magnetic tunnel junction is formed by the first magnetic layer 14, the second magnetic layer 16, and the nonmagnetic layer 15 sandwiched therebetween. Hereinafter, the magnetoresistive effect element is also referred to as an MTJ element.

The first magnetic layer 14 and the second magnetic layer 16 contain a material having magnetic property, and the first magnetic layer 14 and the second magnetic layer 16 are also collectively referred to as a magnetic layer. The direction of magnetization of the second magnetic layer 16 is variable. The direction of magnetization of the first magnetic layer 14 is in a fixed state, and has a predetermined direction. The second magnetic layer 16 whose the direction of magnetization is variable is also referred to as a storage layer, a variable layer, and a magnetization free layer, and the first magnetic layer 14 whose the direction of magnetization is in a fixed state is also referred to as a reference layer or a fixed layer. Arrows in the first magnetic layer 14 and the second magnetic layer 16 in FIG. 1 represent the directions of magnetization of the first magnetic layer 14 and second magnetic layer 16.

Perpendicular magnetization will be described using FIG. 1. The first magnetic layer 14 and the second magnetic layer 16 have magnetic anisotropy in a direction perpendicular or substantially perpendicular to a layer surface. The directions of easy magnetization of the second magnetic layer 16 and first magnetic layer 14 are perpendicular or substantially perpendicular to the layer surface of the magnetic layer. In the direction of easy magnetization (magnetic anisotropy) perpendicular or substantially perpendicular to the layer surface, magnetization facing the direction perpendicular or substantially perpendicular to the layer surface is referred to as perpendicular magnetization. Therefore, the MTJ element of the present embodiment is a perpendicular magnetization type MTJ element.

The direction of easy magnetization is a direction in which, when a ferromagnetic substance of a certain macro size is assumed, internal energy of the magnetic substance becomes the lowest if spontaneous magnetization is oriented in the direction in a state in which there is no external magnetic field.

Next, a data retention mechanism of the MTJ element of the present embodiment will be described. The first magnetic layer 14 and the second magnetic layer 16 are positioned between the two electrodes 11 and 17. When a magnetization switching current is supplied to the second magnetic layer 16 via the electrodes 11 and 17, the angular momentum of spin-polarized electrons generated by the current is transferred to the magnetization (spin) of the second magnetic layer 16. The direction of magnetization of the second magnetic layer 16 is thereby reversed. That is, the direction of magnetization of the second magnetic layer 16 is variable according to the direction in which the current flows. The magnetization switching current is a current for reversing the direction of magnetization.

On the other hand, the magnetization switching current is supplied to also the first magnetic layer 14 via the electrodes 11 and 17 in the same manner. In this case, the direction of magnetization of the first magnetic layer 14 is in a fixed state, and is maintained in a predetermined direction. The direction of magnetization of the first magnetic layer 14 being "maintained in a predetermined direction" or "in a fixed state" means that, when the magnetization switching current of the second magnetic layer 16 supplied between the two electrodes from the outside flows through the first magnetic layer 14, the direction of magnetization of the first magnetic layer 14 is kept in a predetermined direction when the direction of magnetization before flowing is compared with that after flowing.

Therefore, in the MTJ element A, a magnetic layer having a large magnetization switching current supplied via the two electrodes 11 and 17 from the outside is used as the first magnetic layer 14, and a magnetic layer having a smaller magnetization switching current supplied via the two electrodes 11 and 17 than that of the first magnetic layer 14 is used as the second magnetic layer 16, so that the MTJ element A is formed, which includes the second magnetic layer 16 whose the direction of magnetization is variable and the first magnetic layer 14 whose the direction of magnetization is maintained.

When magnetization reversing is caused by spin-polarized electrons, the magnitude of the magnetization switching current thereof is proportional to the damping constant, magnetic coercive force, anisotropic magnetic field, and volume of the magnetic layer. Thus, a difference between the magnetization switching current of the second magnetic layer 16 and the magnetization switching current of the first magnetic layer 14 can be provided by the above values being appropriately adjusted.

When the magnetization switching current of the second magnetic layer 16 supplied through the two electrodes 11 and 17 is supplied to the MTJ element A, the direction of magnetization of the second magnetic layer 16 changes in accordance with the direction in which the current flows, and the relative magnetization arrangement of the first magnetic layer 14 and second magnetic layer 16 changes. Accordingly, the MTJ element A is in either a high resistance state (state in which the magnetization array is antiparallel) or a low resistance state (state in which the magnetization array is parallel), which can hold data.

(Materials of Layers)

The lower electrode 11 is preferably formed of a material having low electric resistance and excellent diffusion resistance. The lower electrode 11 may function as a buffer layer in order to grow a flat magnetic layer having perpendicular magnetization. The lower electrode 11 has a laminated structure including a metal layer of tantalum (Ta), copper (Cu), ruthenium (Ru), or iridium (Ir) or the like.

A material used for the upper electrode 17 preferably has low electrical resistance and diffusion resistance. As the material of the upper electrode 17, for example, Ta is used.

The spacer layer 13 is formed of a metal such as ruthenium (Ru) or Ta.

A conductive ferromagnetic material having an $L1_0$ structure or an $L1_1$ structure such as FePd, FePt, CoPd, or CoPt, a conductive material such as CoFeB, and a conductive ferrimagnetic material such as TbCoFe are used as the material of the first magnetic layer 14. The first magnetic layer 14 may be a conductive artificially layered structure formed of a magnetic material (for example, NiFe, Fe, or Co or the like) and a nonmagnetic material (Cu, Pd, or Pt or the like).

A shift adjustment layer (also referred to as a shift correcting layer or a bias magnetic field layer) 12 is provided so as to be adjacent to the first magnetic layer 14 in order to bring the magnetic field from the first magnetic layer 14 to the second magnetic layer 16 closer to zero. The magnetization of the shift adjustment layer 12 is in a fixed state, and the direction of magnetization of the shift adjustment layer is set opposite to the direction of magnetization of the first magnetic layer 14. For example, the shift adjustment layer 12 is formed of the same material as the first magnetic layer 14.

An insulating material such as magnesium oxide (MgO), magnesium nitride (MgN), aluminum oxide ($Al_2O_3$), aluminum nitride (AlN), or a stacked film thereof is used as the material of the nonmagnetic layer 15. For example, the nonmagnetic layer 15 is formed of an insulating film containing MgO as a main component. A nonmagnetic metal or a nonmagnetic semiconductor may be used for the nonmagnetic layer 15.

The second magnetic layer 16 is formed of a magnetic material containing an element in the fourth period (from the atomic number 19 to the atomic number 36). For example, one or more elements selected from the group consisting of manganese (Mn), iron (Fe), and cobalt (Co) are contained as a main component. Nickel (Ni) may be used as a magnetic element instead of Mn, Fe and Co. The second magnetic layer 16 may contain boron (B) in addition to at least one of Mn, Fe and Co. The second magnetic layer 16 is formed of, for example, CoFeB.

As the first insulating layer 18, an insulator formed of HfN or the like is used.

The first conductive layer 19 is a film containing, for example, one or more of Fe, Pd, Pt, and Co or the like.

The second insulating layer 20 is an insulator having higher physical etching resistance than that of the third insulating layer 21, and for example, AlO or the like is used.

For the third insulating layer 21, an insulating film formed of SiN or SiO or the like is used.

The material of the intermediate layer (not shown) is CoFeB or the like. By providing the intermediate layer, characteristics such as prevention of the atomic diffusion of the magnetic layer and nonmagnetic layer 15 can be improved.

The material of the second conductive layer (not shown) is, for example, Ta or Pt or the like. By providing the second conductive layer, the magnetic layer 16 can be protected from damage due to hard mask removal or upper electrode formation.

The material of the underlayer (not shown) is a conductor containing, for example, Ta, Ru, and Hf or the like. By providing the underlayer, the crystallinities of the shift adjustment layer 12 and magnetic layer 14 can be improved.

(Manufacturing Method)

The manufacturing method of an MTJ element A of the first embodiment will be described using FIGS. 2A to 2E and FIGS. 3A to 3E.

FIGS. 2A to 2E and FIGS. 3A to 3E are cross-sectional step charts illustrating steps of the manufacturing method of an MTJ element according to the present embodiment.

First, a shift adjustment layer 12, a spacer layer 13, a first magnetic layer 14, a nonmagnetic layer 15, a second magnetic layer 16, and a hard mask 23 are deposited in this order from the side of a lower electrode 11 on the lower electrode 11 using the sputtering method or the atomic layer deposition (ALD) method or the like. As a result, a laminated structure (processed layer) 1Z for forming a top free type MTJ element is formed (FIG. 2A).

The sputtering method or the ALD method or the like is also used for depositing an intermediate layer (not shown), a second conductive layer and an underlayer.

The hard mask 23 provided on the upper surface of the second magnetic layer 16 is processed into a pattern 23A having a predetermined shape (for example, a cylindrical shape having a cross-sectional area S2 (S2<S1) and a height d) by lithography and etching, and the pattern 23A used as a mask for processing the laminated structure 1Z including the first magnetic layer 14, the second magnetic layer 16, and the shift adjustment layer 12 is formed on the upper surface of the laminated structure 1Z (FIG. 2B).

The ion milling of the laminated structure 1Z is performed using the pattern 23A as a mask.

The ion milling for processing the laminated structure 1Z is ion milling using an inert gas such as argon (Ar), krypton (Kr), or xenon (Xe). In the present embodiment, the laminated structure 1Z is processed by ion milling using Ar. The laminated structure 1Z may be processed by etching using gas cluster ions.

The incident angle $\theta$ of an ion (ion beam) with respect to the laminated structure 1Z in the ion milling is set to, for example, about 50° with the direction perpendicular to the layer surface of the processed layer included in the laminated structure 1Z as a reference angle (0°).

By performing the ion milling using the upper surface of the first magnetic layer 14 as a stopper, as shown in FIG. 2C, the second magnetic layer 16 and nonmagnetic layer 15 having a shape corresponding to the pattern 23A of the hard mask 23 are formed on the first magnetic layer 14.

Figure 2D:
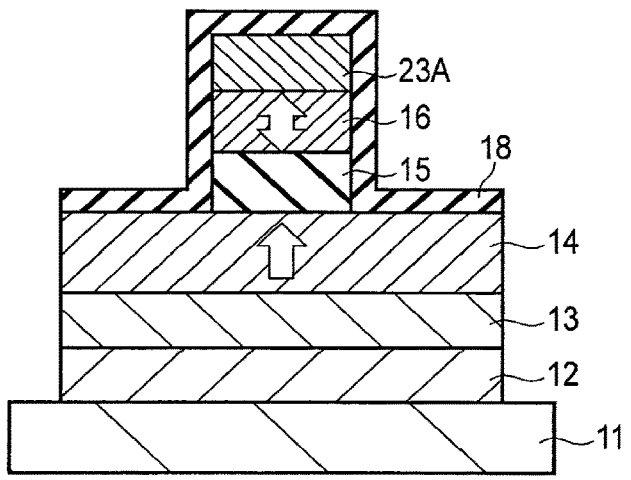

A first insulating layer 18 having a predetermined layer thickness T1 (for example, 3 nm) is formed so as to cover the pattern 23A, the second magnetic layer 16, and the nonmagnetic layer 15 (FIG. 2D).

The first insulating layer 18 may be formed using a vacuum film formation technique such as ion beam sputtering, ion plating, vacuum deposition, ALD method, or CVD method, and then insulated by natural oxidation or oxygen-nitrogen plasma or the like.

The first insulating layer 18 on the side surfaces of the second magnetic layer 16 and nonmagnetic layer 15 is formed of one material selected from HfN and WN or the like, for example.

Figure 2E:
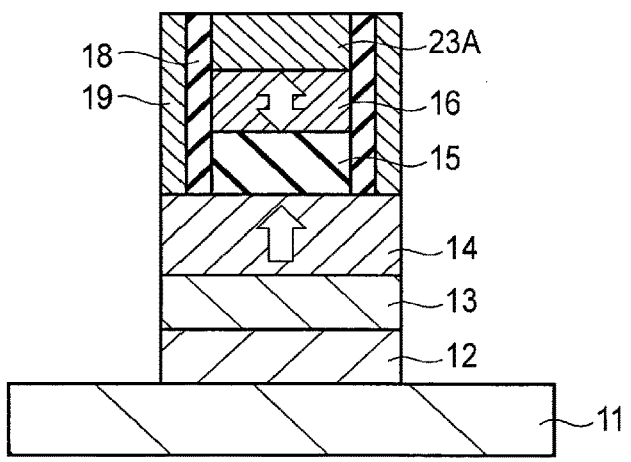

After the first insulating layer 18 is formed, the first insulating layer 18 except the side surface of the nonmagnetic layer 15, the side surface of the second magnetic layer 16, and the side surface of the pattern 23A is removed by ion milling. Furthermore, when ion milling is performed again along the side surface of the first insulating layer 18, the first magnetic layer 14, spacer layer 13, and shift adjustment layer 12 having a predetermined shape (for example, the cross-sectional areas S1 of the shift adjustment layer 12, spacer layer 13, and first magnetic layer 14) are formed. At that time, a first conductive layer 19 is formed so as to cover the side surface of the first insulating layer 18 (FIG. 2E).

The first conductive layer 19 is a residue generated by ion milling. When the ion milling of FIG. 2E is performed, a residue derived from the first magnetic layer 14 is deposited so as to cover the side surface of the first insulating layer 18, to form the first conductive layer 19.

As shown in FIG. 3A, after the MTJ element having a predetermined shape (for example, the cross-sectional area S1 of the first magnetic layer 14) is formed by processing the laminated structure, the hard mask 23 (pattern 23A) is removed by, for example, oxygen plasma etching or the like.

A second insulating layer 20 having a predetermined layer thickness T1 (for example, 3 nm) is formed so as to cover the side surface of the shift adjustment layer 12, the side surface of the spacer layer 13, the first magnetic layer 14, the upper surface of the second magnetic layer 16, the first insulating layer 18, and the first conductive layer 19 (FIG. 3B). At this time, by forming the film at an angle, the second insulating layer 20 on the second magnetic layer 16 can be thinner than the second insulating layer 20 on the upper and side surfaces of the first conductive layer 19.

The second insulating layer 20 may be formed using a vacuum film formation technique such as ion beam sputtering, ion plating, vacuum deposition, ALD method, or CVD method, and then insulated by natural oxidation or oxygen-nitrogen plasma or the like.

After the second insulating layer 20 is formed, a third insulating layer 21 is deposited by, for example, the CVD method so as to cover the MTJ element as the laminated structure including the first insulating layer 18 (FIG. 3C).

Figure 3D:
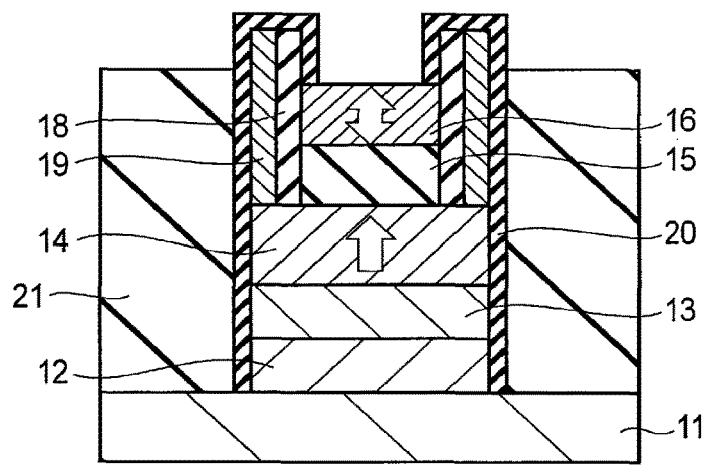

As shown in FIG. 3D, the third insulating layer 21 is removed until the upper surface of the third insulating layer 21 is positioned at the same level as or at a level lower than that of the upper surface of the second magnetic layer 16, for example, by ion milling after the third insulating layer 21 is formed (FIG. 3D). At this time, since the second insulating layer 20 has higher ion milling resistance than that of the third insulating layer 21, the second insulating layer 20 remains on the upper and side surfaces of the first conductive layer 19. However, the thin portion of the second insulating layer 20 formed on the upper surface of the second magnetic layer 16 is scraped, to expose the second magnetic layer 16.

Figure 3E:
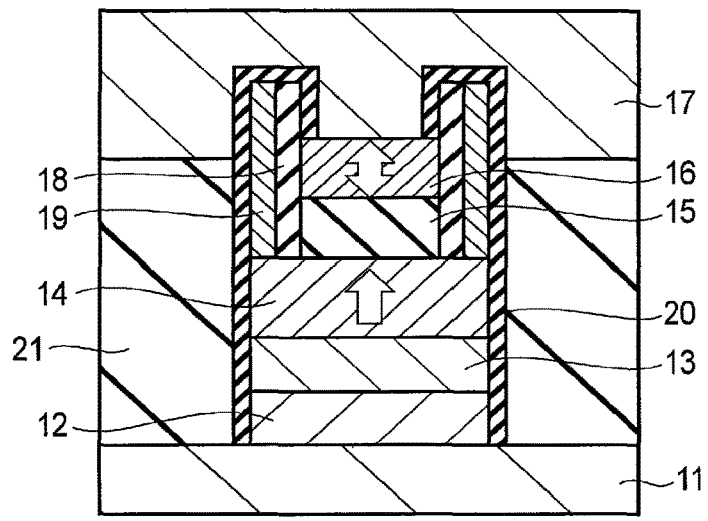

After the second magnetic layer 16 is exposed, an upper electrode 17 is formed on the second magnetic layer 16, the second insulating layer 20, and the third insulating layer 21 by, for example, the sputtering method (FIG. 3E).

Through the above manufacturing step, the MTJ element A of the first embodiment is formed.

Here, in the conventional manufacturing method, a short circuit caused by a side deposit when the first magnetic layer 14 is formed is feared. In particular, when the first magnetic layer 14 is formed of a material difficult to be insulated, such as Pt or Pd, the material is considered to have a large influence. The step of removing the redeposit by ion milling or the like after the first magnetic layer 14 is formed has a high probability of damaging the side surface of the MTJ element by ion milling, and the influence of side damage cannot be ignored in a minute MTJ element of 20 nm or less.

A method such as controlling so as to prevent the redeposit from adhering according to the condition of ion milling when the first magnetic layer 14 is formed makes it difficult to completely suppress the short circuit.

In the MTJ element A of the first embodiment, the first conductive layer 19 is formed, and the second insulating layer 20 is then formed, which makes it possible to surely prevent the contact of the first conductive layer 19 with the upper electrode 17 without damaging the MTJ element.

The second insulating layer 20 may cover at least a part of the first conductive layer so as to prevent the contact of the first conductive layer 19 with the upper electrode 17.

[Second Embodiment]

Hereinafter, an MTJ element B of a second embodiment and a method for manufacturing the same will be described with reference to FIG. 4 and FIGS. 5A to 5F.

In the present embodiment, the descriptions of constituent elements common to those in the first embodiment are made as necessary.

The structure of the MTJ element B of the second embodiment will be described using FIG. 4.

In the MTJ element A of the first embodiment shown in FIG. 1, the second insulating layer 20 is provided along the first conductive layer 19. However, as shown in FIG. 4, the MTJ element B of the second embodiment has a structure in which a second insulating layer 20 is provided along a third insulating layer 21, and covers a protruding first insulating layer 18 and first conductive layer 19.

The method for manufacturing the MTJ element B of the second embodiment will be described using FIGS. 5A to 5F. Here, the method for manufacturing the MTJ element B of the present embodiment will be described by appropriately using FIGS. 2A to 2E.

FIGS. 5A to 5F are cross-sectional step charts illustrating steps of the method for manufacturing the MTJ element B of the present embodiment.

First, as in the first embodiment, the steps of FIGS. 2A to 2E are performed.

Next, the steps will be described using FIGS. 5A to 5F.

Figure 5A:
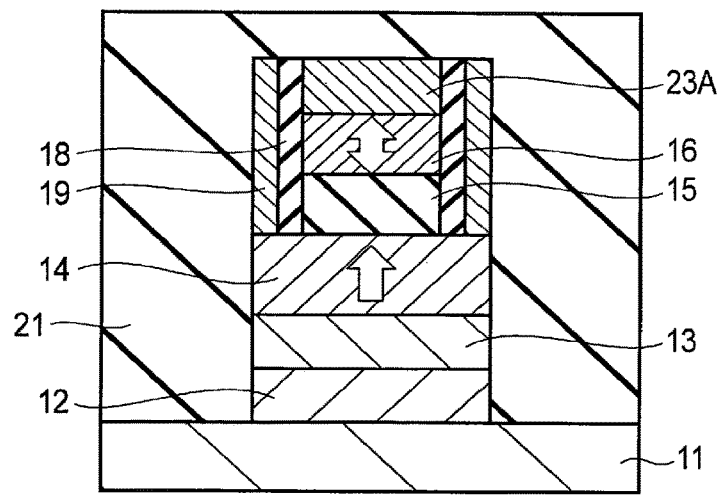
FIGS. 5A, 5B, 5C, 5D, 5E, and 5F illustrate a method for manufacturing the magnetoresistive effect element of the second embodiment.

After an MTJ element having a predetermined shape is formed by processing a laminated structure, a third insulating layer 21 is deposited, for example, by the CVD method so as to cover an MTJ element as the laminated structure including a first insulating layer 18 (FIG. 5A).

Figure 5B:
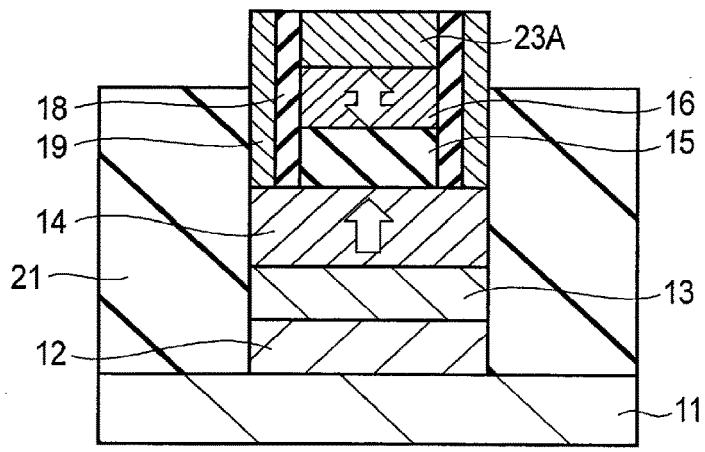

After the third insulating layer 21 is formed, the third insulating layer 21 is removed by, for example, ion milling until an upper surface of the third insulating layer 21 is lower than the interface between a hard mask 23 and a second magnetic layer 16 (FIG. 5B).

Ion milling may be performed so that the upper surface of the third insulating layer 21 is above an upper surface of the magnetic layer 16 when the third insulating layer 21 is removed regardless of FIG. 5B.

Figure 5C:
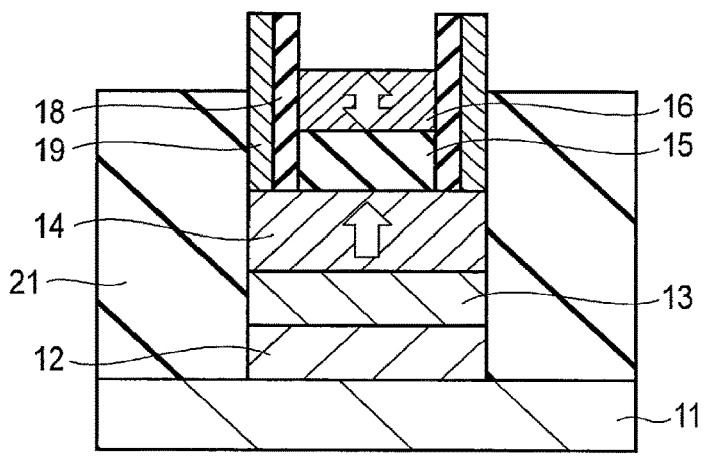
Figure 5D:
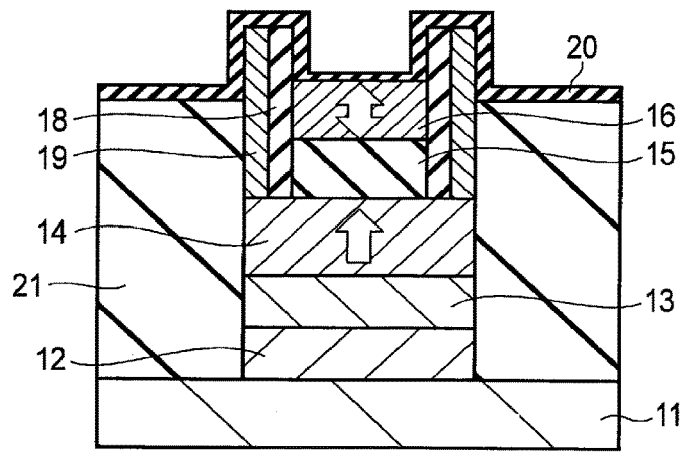

After the third insulating layer 21 is removed, the hard mask 23 (pattern 23A) is removed by, for example, oxygen plasma etching or the like (FIG. 5C).

A second insulating layer 20 having a predetermined layer thickness T1 (for example, 3 nm) is formed by, for example, the sputtering method so as to cover a first conductive layer 19, the upper surface of the third insulating layer 21, and the upper surface of the MTJ element. At this time, by forming the film at an angle, the second insulating layer 20 on the second magnetic layer 16 can be thinner than the second insulating layer 20 on the upper and side surfaces of the first conductive layer 19 (FIG. 5D) (for example, 1 nm or less).

Figure 5E:
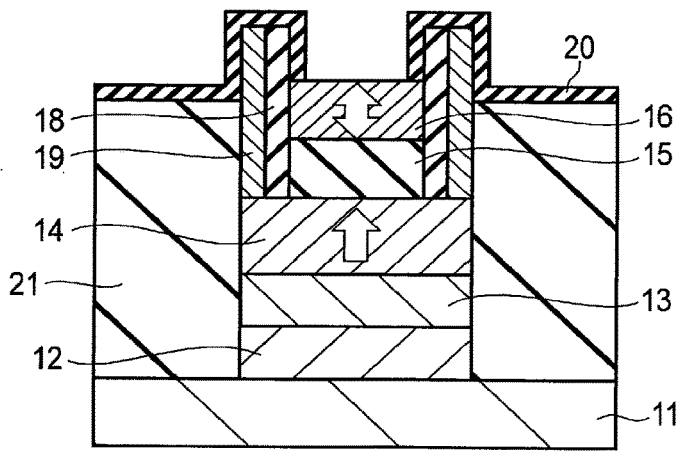

After the second insulating layer 20 is formed, the second insulating layer 20 of the second magnetic layer 16 is removed by, for example, sputter etching or the like. At this time, the second insulating layer 20 deposited on the other portion remains without being completely removed because the second insulating layer 20 is thick (FIG. 5E).

Figure 5F:
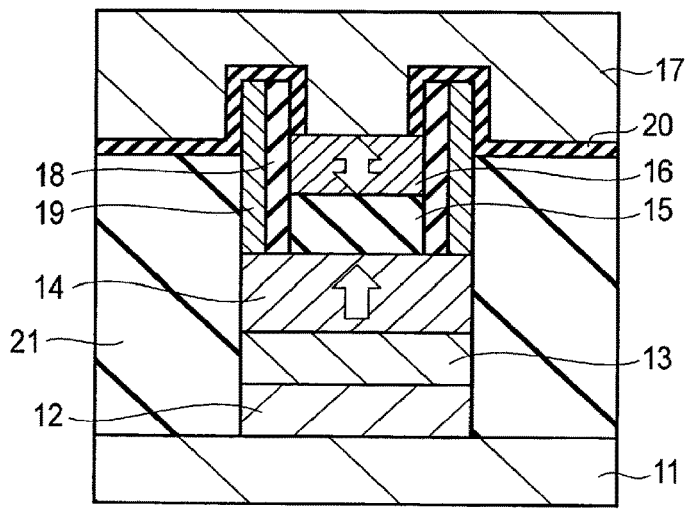

After the second magnetic layer 16 is exposed, an upper electrode 17 is formed on the upper surface of the second magnetic layer 16, the second insulating layer, and the third insulating layer 21 by, for example, the sputtering method (FIG. 5F).

Through the above manufacturing step, the MTJ element B of the second embodiment is formed.

The contact of the first conductive layer 19 with the upper electrode 17 can be reliably prevented without damaging the MTJ element as in the first embodiment. Since the second insulating layer is formed along the upper surface of the third insulating layer 21 in the MTJ element B of the present embodiment, the manufacturing step is simpler than that of the MTJ element A. Specifically, in the MTJ element A of the first embodiment, the step of exposing the upper part of the MTJ element A is performed by removing the third insulating layer 21 by ion milling in a state where the second insulating layer 20 is formed. The second insulating layer 20 is considerably harder than the third insulating layer 21, which makes it difficult to remove the third insulating layer 21 formed in a recessed portion in the upper part of the MTJ element. On the other hand, since the second insulating layer 20 is formed after the step of exposing the upper part of the MTJ element in the second embodiment, the hardness of the second insulating layer 20 is not limited. Since the pattern 23A is removed after the step of exposing the upper part of the MTJ element, the third insulating layer 21 is not formed in the recess in the upper part of the MTJ element. So, there is no concern as described above, and the manufacturing step is simpler than that of the MTJ element A.

[Third Embodiment]

Hereinafter, with reference to FIG. 6 and FIGS. 7A to 7G, an MTJ element C of a third embodiment and a method for manufacturing the same will be described.

In the present embodiment, the descriptions of constituent elements common to those in the second embodiment are made as necessary.

(Structure)

The structure of the MTJ element C of the third embodiment will be described using FIG. 6.

Figure 4:
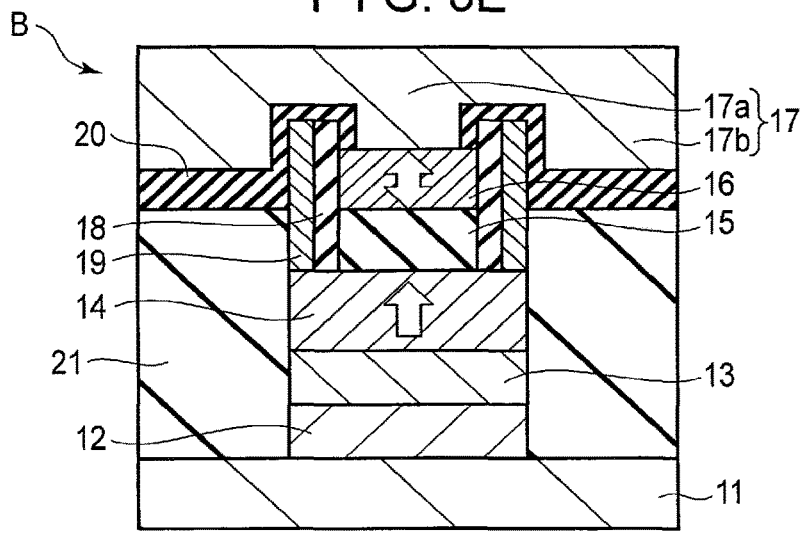
FIG. 4 is a cross-sectional view of a magnetoresistive effect element of a second embodiment.
Figure 6:
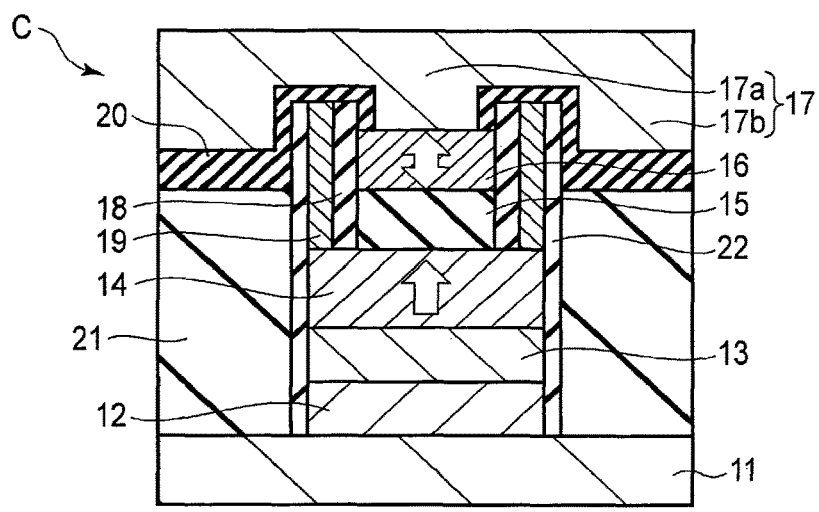
FIG. 6 is a cross-sectional view of a magnetoresistive effect element of a third embodiment.

The difference between the MTJ element B of the second embodiment shown in FIG. 4 and the MTJ element C of the third embodiment is that the MTJ element C has a fourth insulating layer 22 covering the side surfaces of a shift adjustment layer 12, spacer layer 13, first magnetic layer 14, and first conductive layer 19, as shown in FIG. 6. That is, the fourth insulating layer 22 is in contact with also a third insulating layer 21. It can be said that the fourth insulating layer 22 faces the shift adjustment layer 12, the spacer layer 13, the first magnetic layer 14, and the first conductive layer 19 in a second direction.

The material of the fourth insulating layer 22 is, for example, SiN.

(Manufacturing Method)

A method for manufacturing the MTJ element C of the third embodiment will be described using FIGS. 7A to 7G. Herein, the method for manufacturing the MTJ element C of the present embodiment will be described appropriately using FIGS. 2A to 2E.

FIGS. 7A to 7G are cross-sectional step charts illustrating steps of the manufacturing method of an MTJ element according to the present embodiment.

First, as in the second embodiment, the steps of FIGS. 2A to 2E are performed.

The steps will be described using FIGS. 7A to 7G.

Figure 7A:
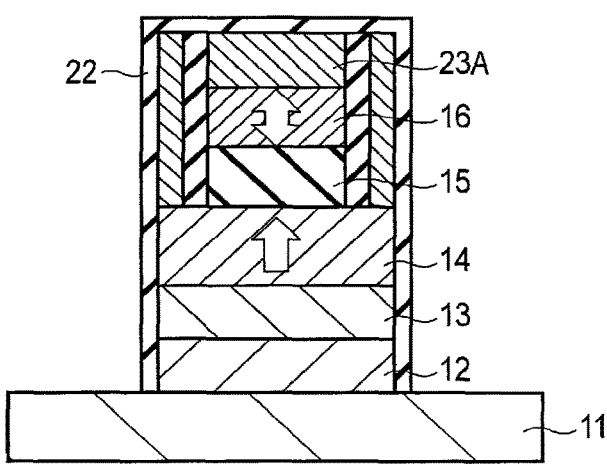

After an MTJ element having a predetermined shape is formed by processing a laminated structure, a fourth insulating layer 22 is deposited on a substrate, for example, by the CVD method so as to cover the MTJ element (FIG. 7A).

Figure 7B:
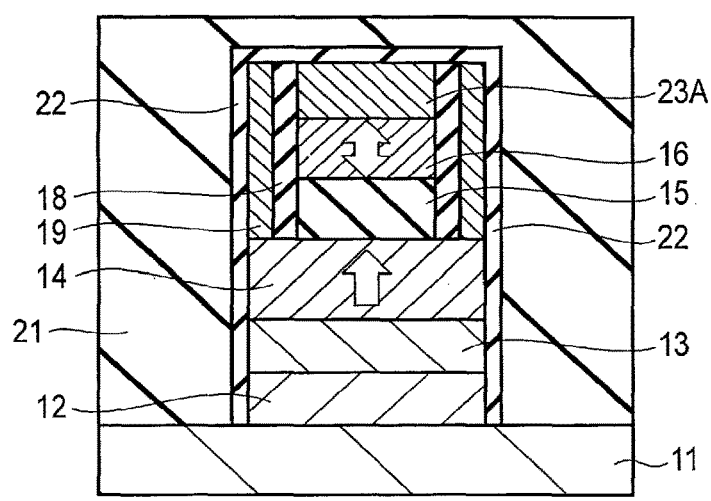

Next, a third insulating layer 21 is deposited on the substrate by, for example, the sputtering method so as to cover the MTJ element (FIG. 7B).

After the third insulating layer 21 is formed, the third insulating layer 21 is removed by, for example, ion milling until the upper surface of the third insulating layer 21 is at the same level as or at a level lower than that of the upper surface of the second magnetic layer 16 (FIG. 7C). Ion milling may be performed so that the upper surface of the third insulating layer 21 is located above the upper surface of the magnetic layer 16 when the third insulating layer 21 is removed regardless of FIG. 7B.

After the third insulating layer 21 is removed, a hard mask 23 (pattern 23A) is removed by, for example, oxygen plasma etching or the like (FIG. 7D).

A second insulating layer 20 having a predetermined layer thickness T1 (for example, 3 nm) is formed by, for example, the sputtering method so as to cover a first conductive layer 19, the upper surface of the third insulating layer 21, and the upper surface of the MTJ element. At this time, by forming the film at an angle, the second insulating layer 20 on the second magnetic layer 16 can be thinner than the second insulating layer 20 on the upper and side surfaces of the first conductive layer 19 (FIG. 7E) (for example, 1 nm or less).

Figure 7F:
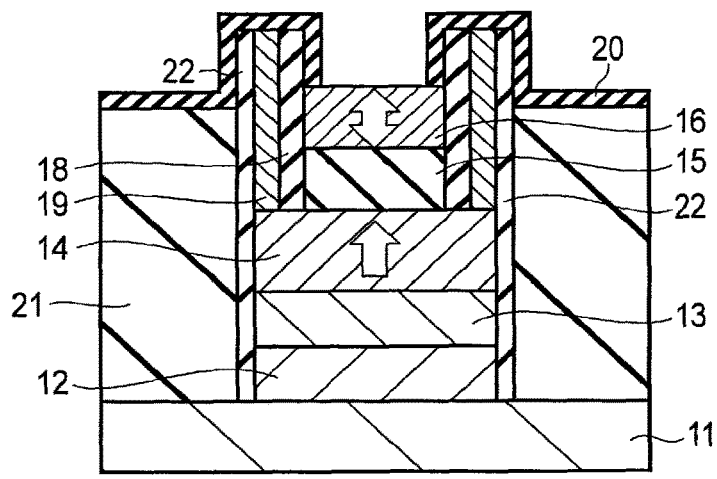

After the second insulating layer 20 is formed, the insulating layer of the second magnetic layer 16 is removed by, for example, sputter etching or the like. At this time, the second insulating layer 20 deposited on the other portion remains without being completely removed because the second insulating layer 20 is thick (FIG. 7F).

Figure 7G:
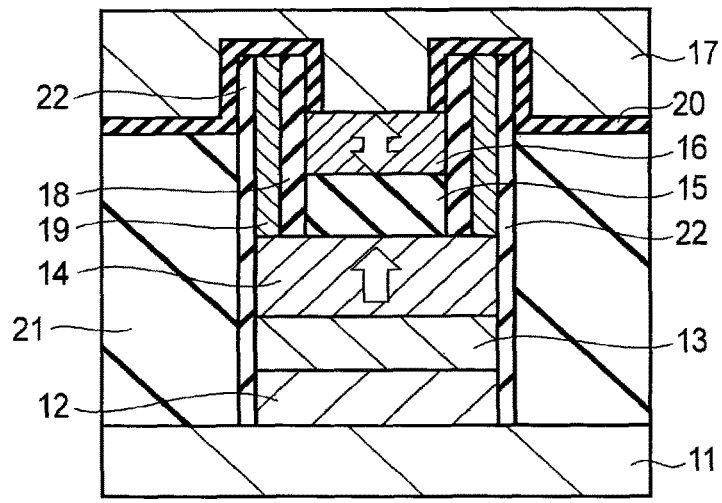

After the second magnetic layer 16 is exposed, an upper electrode 17 is formed on the upper surface of the second magnetic layer 16, the second insulating layer 20, and the third insulating layer 21 by, for example, the sputtering method (FIG. 7G).

Through the above manufacturing step, the MTJ element C of the third embodiment is formed.

As in the first embodiment, the MTJ element C of the present embodiment can prevent the contact of the first conductive layer 19 with the upper electrode 17 without damaging the MTJ element. The third embodiment can be more simply manufactured than the first embodiment for the same reason as that in the second embodiment. Furthermore, in the third embodiment, by providing the MTJ element with the fourth insulating layer 22, external factors such as natural oxidation in the manufacturing step can be prevented.

[Fourth Embodiment]

Hereinafter, an MTJ element D of a fourth embodiment and a method for manufacturing the same will be described with reference to FIGS. 8 and 9A to 9E.

In the present embodiment, the descriptions of constituent elements common to those in the first embodiment are made as necessary.

Figure 8:
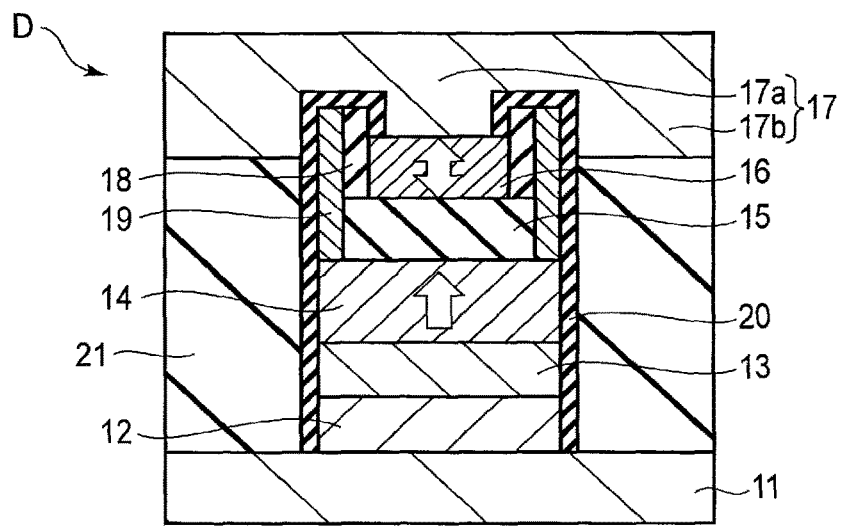
FIG. 8 is a cross-sectional view of a magnetoresistive effect element of a fourth embodiment.

The structure of the MTJ element D of the fourth embodiment will be described using FIG. 8.

In the MTJ element A of the first embodiment shown in FIG. 1, a first insulating layer 18 is formed so as to cover the side surfaces of a nonmagnetic layer 15 and second magnetic layer 16. However, in the MTJ element D of the fourth embodiment shown in FIGS. 9A to 9E, the first insulating layer 18 covers the side surface of the second magnetic layer 16. That is, in a second direction, the first insulating layer 18 does not face the nonmagnetic layer 15 but faces a second portion 17b and the second magnetic layer 16.

(Manufacturing Method)

A method for manufacturing the MTJ element D of the fourth embodiment will be described using FIGS. 9A to 9E. Herein, the method for manufacturing the MTJ element D of the present embodiment will be described by appropriately using FIGS. 3A to 3E.

FIGS. 9A to 9E are cross-sectional step charts illustrating steps of the manufacturing method of the MTJ element D according to the present embodiment.

As in the first embodiment, a shift adjustment layer 12, a spacer layer 13, a first magnetic layer 14, a nonmagnetic layer 15, a second magnetic layer 16, and a hard layer 23 are first deposited in this order from the side of a lower electrode 11 on the lower electrode 11 by the sputtering method or the ALD method or the like. As a result, a laminated structure (processed layer) 1Z for forming a top free type MTJ element is formed (FIG. 9A).

The sputtering method or the ALD method or the like is also used for depositing an intermediate layer (not shown), a second conductive layer and an underlayer.

The hard mask 23 provided on the upper surface of the second magnetic layer 16 is processed into a pattern 23A having a predetermined shape (for example, a cylindrical shape having a cross-sectional area S2 (S2<S1) and a height d) by lithography and etching. The pattern 23A used as a mask for processing the laminated structure 1Z including the first magnetic layer 14, the second magnetic layer 16, and the shift adjustment layer 12 is formed on the upper part of the laminated structure 1Z (FIG. 9B).

The ion milling of the laminated structure 1Z is performed using the pattern 23A as a mask.

By performing ion milling using the upper surface of the nonmagnetic layer 15 as a stopper, as shown in FIG. 9C, the second magnetic layer 16 having a shape corresponding to the pattern 23A of the hard mask 23 is formed on the nonmagnetic layer 15.

Figure 9D:
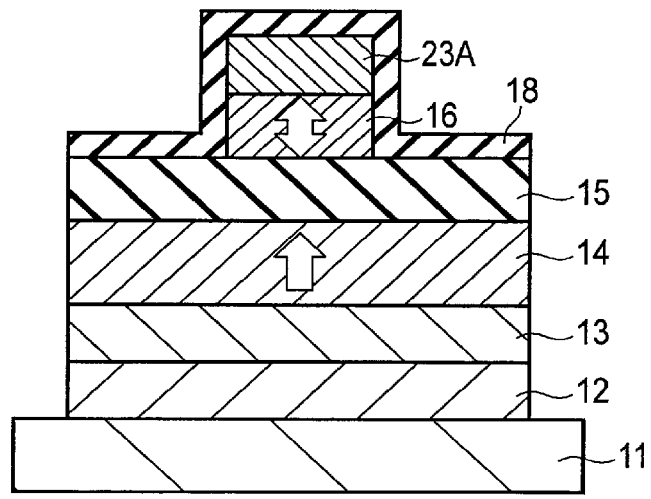

A first insulating layer 18 having a predetermined layer thickness T1 (for example, 3 nm) is formed so as to cover the pattern 23A and the second magnetic layer 16 (FIG. 9D).

Figure 9E:
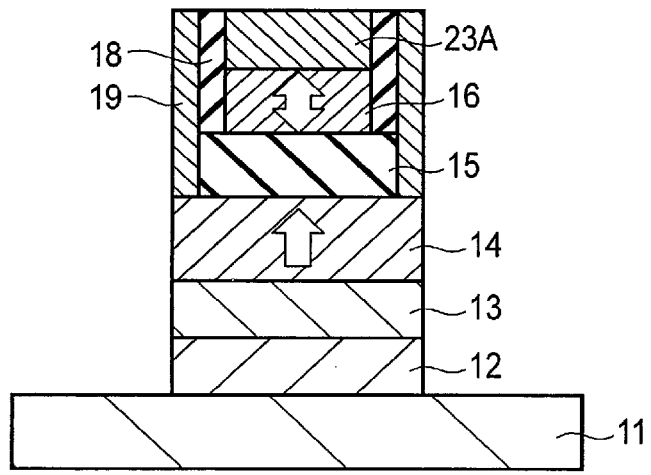

After the first insulating layer 18 is formed, the first insulating layer 18 except the side surfaces of the second magnetic layer 16 and pattern 23A is removed by ion milling. Furthermore, when the ion milling is performed again along the side surface of the first insulating layer 18, the shift adjustment layer 12, spacer layer 13, first magnetic layer 14, and nonmagnetic layer 15 having a predetermined shape (for example, the cross-sectional areas S1 of the shift adjustment layer 12, spacer layer 13, and first magnetic layer 14, and the cross-sectional area S1/2 (S1>S1/2>S2) of the nonmagnetic layer 15) are formed. At that time, a first conductive layer 19 is formed so as to cover the side surfaces of the first insulating layer 18 and nonmagnetic layer 15 (FIG. 9E).

Then, as in the first embodiment, the steps of FIGS. 3A to 3E are performed. However, the steps of FIGS. 3A to 3E are performed while the side surface of the nonmagnetic layer 15 is covered with the first conductive layer 19. That is, the steps of FIGS. 3A to 3E are performed without the first insulating layer 18 covering the side surface of the nonmagnetic layer 15.

Through the above manufacturing step, the MTJ element D of the fourth embodiment is formed.

In the case where a material having high ion milling resistance is used for the nonmagnetic layer 15, stopping ion milling on the upper surface of the nonmagnetic layer 15 is easier than stopping on the upper surface of the first magnetic layer 14 of the first embodiment. That is, the MTJ element D can be more easily produced than the MTJ element A in the manufacturing step.

[Application Example of Embodiment]

Application example of the above-described embodiment will be described using FIGS. 10 and 11. The MTJ element A of the present embodiment is used as a memory element of a magnetic memory, for example, an MRAM. In the present application example, a spin-torque transfer MRAM (STT-MRAM) is exemplified.

(Basic Configuration of Application Example)

As shown in FIG. 10, the STT-MRAM of the present application example includes an MTJ element A, column control circuits 3A and 3B, a row control circuit 4, write circuits 5A and 5B, and a read circuit 6A.

A memory cell array MCA includes a plurality of memory cells MC. The plurality of memory cells MC are arranged in an array form in the memory cell array MCA. In the plurality of memory cells MC, a plurality of bit lines BL and bBL extending in the memory cell array MCA extend in a column direction, and are connected to a word line WL. The bit lines BL and bBL extend in the column direction, and the word lines WL extend in a row direction. The two bit lines BL and bBL form a bit line pair.

The memory cell MC includes one MTJ element A and one select transistor 2. The select transistor 2 is, for example, a field effect transistor.

One end of the MTJ element A is connected to the bit line BL, and the other end of the MTJ element A is connected to one end (source/drain) of a current path of the select transistor 2. The other end (drain/source) of the current path of the select transistor 2 is connected to the bit line bBL. A control terminal (gate) of the select transistor 2 is connected to the word line WL.

As described above, the plurality of memory cells MC arranged in the column direction are connected to the common bit line pair (BL, bBL).

The column control circuit 3A is connected to one ends of the bit lines BL and bBL, and the column control circuit 3B is connected to the other ends of the bit lines BL and bBL. The column control circuits 3A and 3B control the activation and deactivation of the bit lines BL and bBL based on an address signal from the outside. One end of the word line WL is connected to the row control circuit 4. The row control circuit 4 controls the activation and inactivation of the word line WL based on an address signal from the outside.

The write circuits 5A and 5B are connected to one ends and the other ends of the bit lines BL and bBL via the column control circuits 3A and 3B, respectively. Each of the write circuits 5A and 5B includes a source circuit such as a current source for generating a write current $I_{WR}$ or a voltage source and a sink circuit for sinking the write current $I_{WR}$.

The read circuit 6A is connected to the bit lines BL and bBL via the column control circuit 3A. The read circuit 6A includes a voltage source or a current source for generating a read current, a sense amplifier for detecting and amplifying a read signal, and a latch circuit for temporarily holding data, or the like.

When data is written to the MTJ element A, a write current is supplied to the memory cell MC.

When data is written to the MTJ element A, the write circuits 5A and 5B bidirectionally flow the write current $I_{WR}$ to the MTJ element A in the memory cell MC according to data to be written to the memory cell MC. That is, the write current $I_{WR}$ from the bit line BL to the bit line bBL or the write current $I_{WR}$ from the bit line bBL to the bit line BL is output from the write circuits 5A and 5B according to the data to be written to the MTJ element A.

The read circuit 6A supplies a read current to the memory cell MC when data is read from the MTJ element A.

The current value of the write current $I_{WR}$ is set to be larger than a magnetization reversing threshold value. The current value of the read current is set smaller than the magnetization reversing threshold value so that the magnetization of the storage layer of the MTJ element A is not reversed by the read current.

The current value or the potential is different depending on the magnitude of the resistance value of the MTJ element A to which the read current is supplied. Data stored in the MTJ element A is determined on the basis of a variation amount (read signal, read output) according to the magnitude of the resistance value.

In addition to the above components, the MTJ element A in the memory cell MC, for example, the MTJ element A according to the above-described embodiment may be the MTJ element B, the MTJ element C, or the MTJ element D. For example, a buffer circuit, a state machine (control circuit), or an ECC (Error Checking and Correcting) circuit or the like may be provided in the same chip as the memory cell array MCA. Furthermore, in the STT-MRAM, the two read circuits 6A may be respectively provided on one end and the other end of the memory cell array MCA in the column direction, regardless of the example of FIGS. 10 and 11.

(Structure of Memory Cell)

In FIG. 11, the memory cell MC is formed in an active region of a semiconductor substrate 30. The active region is partitioned by an insulating film 31 embedded in an element isolation region of the semiconductor substrate 30. The semiconductor substrate 30 is covered with third insulating layers 21A, 21B and 210.

The MTJ element A is provided in the third insulating layer 21C. The upper end of the MTJ element A is connected to the bit line BL via the upper electrode 17. The lower end of the MTJ element A is connected to a source/drain diffusion layer 34B of the select transistor 2 via a contact wiring BEC embedded in the third insulating layers 21A and 21B. A source/drain diffusion layer 34A of the select transistor 2 is connected to the bit line bBL via a contact wiring bBEC in the third insulating layer 21A.

The select transistor 2 is configured as a field effect transistor having a planar structure. That is, the select transistor 2 includes a gate electrode 33 on an active region AA between the source/drain diffusion layer 34A and the source/drain diffusion layer 34B with a gate insulating film 32 interposed therebetween. The gate electrode 33 extends in the row direction and is used as the word line WL.

In addition to the above, the MTJ element A provided in the third insulating layer 21C may be the MTJ element B and the MTJ element C.

Regardless of the example of FIGS. 9A to 9E, the MTJ element A may be arranged at a position shifted from just above the contact wiring BEC. Specifically, the MTJ element A may be arranged above the gate electrode 33 or the like of the select transistor 2, for example, using an intermediate wiring layer.

Furthermore, the select transistor 2 may be a field effect transistor having a three-dimensional structure. Examples of the field effect transistor having a three-dimensional structure include Recess Channel Array Transistor (RCAT), and FinFET. The RCAT has a structure in which a gate electrode is embedded in a recess in a semiconductor region via a gate insulating film. The FinFET has a structure in which the gate electrode 33 three-dimensionally intersects rectangular semiconductor regions via a gate insulating film.

Regardless of the example of FIG. 11, two memory cells MC may be provided adjacent to each other in the column direction within one active region. In this case, the two memory cells MC are provided so as to share one bit line bBL and source/drain diffusion layer 34A. Thereby, the cell size of the memory cell MC is reduced.

For example, when the magnetoresistive effect element according to the present embodiment is mounted on the memory cell array, the magnetoresistive effect element in the memory cell array includes those in which the first magnetic layer 14 and the conductive layer 19 are not in contact with each other. Since the first magnetic layer 14 and the conductive layer 19 may be in contact with each other in a formation process, to cause a short-circuit path, the second insulating layer 20 is provided as the insurance. Therefore, in the magnetoresistive effect element according to the present embodiment, a magnetoresistive effect element in which the first magnetic layer 14 and the conductive layer 19 are not in contact with each other is also included in the scope of the present invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetoresistive effect element comprising:
   a first magnetic layer;
   a nonmagnetic layer provided on the first magnetic layer;
   a second magnetic layer provided on the nonmagnetic layer;
   a first insulating layer provided at least on a side surface of the second magnetic layer;
   a second insulating layer covering at least a part of the first insulating layer;
   a conductive layer provided between the first insulating layer and the second insulating layer; and
   an electrode including a first portion on the second magnetic layer and a second portion on a side surface of the second insulating layer,
   wherein a height of a lower surface of the second portion of the electrode is equal to or less than a height of an upper surface of the conductive layer,
   a height of an upper surface of the first insulating layer is greater than a height of an upper surface of the second magnetic layer, and
   the second insulating layer is provided between the first insulating layer and the first portion of the electrode to be in contact with the upper surface of the second magnetic layer.

2. The magnetoresistive effect element of claim 1, wherein the second insulating layer covers a side surface of the first magnetic layer and the conductive layer.

3. The magnetoresistive effect element of claim 1, wherein the conductive layer is in contact with the first magnetic layer.

4. The magnetoresistive effect element of claim 1, wherein the first insulating layer covers the nonmagnetic layer.

5. The magnetoresistive effect element of claim 1, further comprising a third insulating layer provided around the second insulating layer.

6. A magnetic memory comprising:
   a plurality of memory cells,
   wherein at least one of the plurality of memory cells includes the magnetoresistive effect element of claim 1.

7. A magnetoresistive effect element comprising:
   a first magnetic layer;
   a second magnetic layer;
   a nonmagnetic layer provided between the first magnetic layer and the second magnetic layer;
   a first insulating layer including a portion facing at least the second magnetic layer in a second direction intersecting a first direction from the first magnetic layer toward the second magnetic layer;
   a second insulating layer including a portion facing the first insulating layer in the second direction;
   a conductive layer provided between the first insulating layer and the second insulating layer; and
   an electrode including a first portion facing the second magnetic layer in the first direction and a second portion facing the second insulating layer in the second direction,
   wherein a first portion of the second insulating layer is provided between the second portion of the electrode and the conductive layer in the second direction,
   the first insulating layer includes a portion facing the first portion of the electrode in the second direction, and
   a second portion of the second insulating layer is provided between the first insulating layer and the first portion of the electrode in the second direction to be in contact with the second magnetic layer.

8. The magnetoresistive effect element of claim 7, wherein the second insulating layer covers the conductive layer and the first magnetic layer in the second direction.

9. The magnetoresistive effect element of claim 7, wherein the conductive layer is in contact with the first magnetic layer.

10. The magnetoresistive effect element of claim 7, wherein the first insulating layer covers the nonmagnetic layer.

* * * * *